(12) United States Patent
Mizutani et al.

(10) Patent No.: US 7,282,190 B2
(45) Date of Patent: Oct. 16, 2007

(54) SILICON LAYER PRODUCTION METHOD AND SOLAR CELL PRODUCTION METHOD

(75) Inventors: Masaki Mizutani, Hikone (JP); Shoji Nishida, Hiratsuka (JP); Katsumi Nakagawa, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 10/563,115

(22) PCT Filed: May 17, 2005

(86) PCT No.: PCT/JP2005/009305

§ 371 (c)(1),
(2), (4) Date: Jan. 3, 2006

(87) PCT Pub. No.: WO2005/117079

PCT Pub. Date: Dec. 8, 2005

(65) Prior Publication Data

US 2006/0160336 A1     Jul. 20, 2006

(30) Foreign Application Priority Data

May 27, 2004   (JP)   ............................. 2004-156968

(51) Int. Cl.
*C01B 33/26* (2006.01)
*C30B 15/20* (2006.01)

(52) U.S. Cl. .................... 423/328.2; 117/13; 117/54

(58) Field of Classification Search ................ 117/13, 117/54; 438/57
See application file for complete search history.

(56) References Cited

U.S. PATENT DOCUMENTS

| | | | |
|---|---|---|---|
| 5,486,238 A | 1/1996 | Nakagawa et al. | 136/259 |
| 5,510,151 A | 4/1996 | Matsuyama et al. | 427/509 |
| 5,712,199 A | 1/1998 | Nakagawa et al. | 438/62 |
| 5,714,010 A | 2/1998 | Matsuyama et al. | 118/723 |
| 5,770,463 A | 6/1998 | Nakagawa et al. | 437/2 |
| 5,981,864 A | 11/1999 | Mizutani et al. | 136/244 |
| 5,986,204 A | 11/1999 | Iwasaki et al. | 136/256 |
| 6,110,347 A | 8/2000 | Arao et al. | 205/333 |

(Continued)

FOREIGN PATENT DOCUMENTS

JP    49-11467    1/1974

(Continued)

OTHER PUBLICATIONS

M. Mizutani, et al., "New Type Multicrystalline SI Substrate for PV Application", Proceedings of 19th European PVSEC.

*Primary Examiner*—Felisa Hiteshew
(74) *Attorney, Agent, or Firm*—Fitzpatrick, Cella, Harper & Scinto

(57) ABSTRACT

A solar cell is produced by dipping a multicrystalline silicon substrate 28 in a solution 24 containing silicon, growing a silicon layer on the substrate 28 while decreasing with time the temperature drop rate of the solution during the dipping of the substrate in the solution, and forming a pn junction in the silicon layer. Thereby, there is provided a silicon layer production method that can form a thick layer while restraining the degree of roughness, whereby a low-cost, multicrystalline-silicon solar cell production method is provided that realizes both a large current and a high FF.

4 Claims, 2 Drawing Sheets

U.S. PATENT DOCUMENTS

| | | | |
|---|---|---|---|
| 6,190,937 B1 | 2/2001 | Nakagawa et al. | 438/67 |
| 6,211,038 B1 | 4/2001 | Nakagawa et al. | 438/409 |
| 6,248,948 B1 | 6/2001 | Nakagawa et al. | 136/244 |
| 6,258,666 B1 | 7/2001 | Mizutani et al. | 438/258 |
| 6,258,698 B1 | 7/2001 | Iwasaki et al. | 438/455 |
| 6,331,208 B1 | 12/2001 | Nishida et al. | 117/89 |
| 6,384,313 B2 | 5/2002 | Nakagawa et al. | 136/244 |
| 6,387,780 B1 | 5/2002 | Nishida | 438/497 |
| 6,391,743 B1 | 5/2002 | Iwane et al. | 438/458 |
| 6,429,035 B2 | 8/2002 | Nakagawa et al. | 438/57 |
| 6,452,091 B1 | 9/2002 | Nakagawa et al. | 136/261 |
| 6,464,762 B1 | 10/2002 | Arao | 106/1.22 |
| 6,500,731 B1 | 12/2002 | Nakagawa et al. | 438/455 |
| 6,566,235 B2 | 5/2003 | Nishida et al. | 438/458 |
| 6,566,277 B1 | 5/2003 | Nakagawa et al. | 438/761 |
| 6,664,169 B1 | 12/2003 | Iwasaki et al. | 438/409 |
| 6,682,990 B1 | 1/2004 | Iwane et al. | 438/458 |
| 6,756,289 B1 | 6/2004 | Nakagawa et al. | 438/478 |
| 6,802,900 B2 | 10/2004 | Iwane et al. | 117/54 |
| 6,802,926 B2 | 10/2004 | Mizutani et al. | 156/247 |
| 6,818,104 B2 | 11/2004 | Iwasaki et al. | 204/199 |
| 6,824,609 B2 | 11/2004 | Saito et al. | 117/54 |
| 6,869,863 B2 | 3/2005 | Nishida | 438/497 |
| 6,953,506 B2 | 10/2005 | Iwane et al. | 117/206 |
| 7,022,181 B2 | 4/2006 | Nakagawa et al. | 117/54 |
| 7,118,625 B2 | 10/2006 | Nishida et al. | 117/54 |
| 2005/0087226 A1 | 4/2005 | Nishida et al. | 136/256 |
| 2005/0109388 A1 | 5/2005 | Murakami et al. | 136/255 |
| 2006/0194417 A1 | 8/2006 | Ishihara et al. | 438/479 |

FOREIGN PATENT DOCUMENTS

| | | |
|---|---|---|
| JP | 54-153784 | 12/1979 |
| JP | 61-261292 | 11/1986 |
| JP | 3-256324 | 11/1991 |
| JP | 5-82458 | 4/1993 |
| JP | 11-162859 | 6/1999 |

SILICON LAYER PRODUCTION METHOD AND SOLAR CELL PRODUCTION METHOD

TECHNICAL FIELD

The present invention relates to a solar cell production method utilizing a silicon layer obtained through a liquid phase growth method.

BACKGROUND ART

In order to widely generalize the solar cell, it is necessary to provide an inexpensive solar cell. To reduce the cost, study of various techniques is being progressed at present. As one of the various techniques, Japanese Patent Application Laid-Open No. H11-162859 discloses a technique of growing a high-quality silicon layer on a low-cost multicrystalline silicon substrate containing a comparatively large amount of impurities by a liquid phase epitaxial (LPE) growth method to form a solar cell in the silicon layer. It is expected that this technique reduces the substrate cost of the solar cell. Moreover, it is important, for cost reduction, to improve the photoelectric conversion efficiency of the solar cell. Particularly, it is expected to increase current by means of light trapping effect by providing texture structure on a substrate.

In the case of the conventional LPE growth methods, it is generally performed to dip a substrate in a solution containing a growth species and then to lower the temperature of the solution at a constant rate (hereafter referred to as "linear temperature drop" or "linear cooling"), to thereby grow the growth species on the substrate (see, for example, Japanese Patent Application Laid-Open Nos. 61-261292, H03-256324 and H05-82458).

In the case of the conventional linear temperature drop LPE growth method represented by Japanese Patent Application Laid-Open Nos. 61-261292 and H03-256324, because a monocrystalline substrate is used as a substrate, a flat layer is generally grown, with the exception of having a micro-waviness of about 1 μm at most, which is peculiar to the LPE growth method. When applying the conventional linear temperature drop LPE growth method to silicon layer growth on a multicrystalline silicon substrate, it has been found through experiments by the present inventors that a comparatively flat layer is grown when a substrate surface has been made very flat by a method such as CMP. However, when a low-cost solar cell is to be attained, this method is not preferable because polishing a surface of a substrate extremely increases the substrate cost.

Therefore, when a low-cost solar cell is to be attained, it is a practical method to flatten a substrate only by cutting out a substrate from a multicrystalline silicon ingot with a wire saw or the like and etching the cut out member with a mixed acid. However, it has been found through experiments by the present inventors that when growing a silicon layer on a multicrystalline silicon substrate etched with a mixed acid by the linear temperature drop LPE growth method, the following problem occurs.

That is, on one hand, a problem occurs that when the growth time is short, although the degree of layer roughening is comparatively small, a large amount of current cannot be obtained for a finally formed solar cell. On the other hand, when the growth time is long, another problem occurs that although a thick layer is obtained, the degree of layer roughening increases, so that a solar cell is easily shunted (short-circuited) and the fill factor (FF) lowers.

Although the cause of generation of layer roughening has not been clarified, the present inventors believe that the growth rate of a layer slowly increases with time in the case of linear temperature drop and layer roughening becomes remarkable when the growth rate exceeds a threshold. The phenomenon of layer roughening hardly occurs when a substrate is flat. The present inventors believe that when a layer is grown on a substrate with a rough surface at a rate higher than a specific growth rate, step bunching of epitaxial growth is macroscopically actualized. Moreover, it is believed that this phenomenon remarkably appears when the amount of a solution is large and supply of a growth material is comparatively large. That is, the layer roughening hardly occurs when the slide boat method or tipping method is used and the amount of a solution is small, even in the case of using the same temperature profile mentioned above. However, in the case of using the dipping method in which the amount of a solution is comparatively large, although it has advantage to effect LPE growth on a large number of substrates at the same time, layer roughening is liable to occur, so that development of an optimum LPE growth method has been desired.

Incidentally, Japanese Patent Application Laid-Open No. H05-82458 discloses that when heteroepitaxially growing an $Hg_{1-x}Cd_xTe$ crystal on a sapphire substrate, the temperature drop rate of a melt is decreased with time. In fact, what is disclosed in this patent is to keep the melt temperature (i.e. without temperature drop) after linear temperature drop process in order to prevent mutual diffusion between the sapphire substrate and the HgCdTe layer. Since their LPE utilizes a monocrystalline substrate, surface roughening of an LPE layer hardly occurs. It is apparent that they had no scope to control the LPE layer roughness. On the other hand, our experiment of silicon LPE revealed that LPE process comprising constant melt temperature has curious property. That is, the LPE layer thickness will increase at the beginning but then WILL decrease. This phenomenon is reported in Proceedings of $19^{th}$ European PVSEC by present authors. Therefore the temperature profile disclosed in the prior art is not suitable for PV use, which requires a certain amount of a layer thickness for generating enough photocurrent.

DISCLOSURE OF THE INVENTION

It is, therefore, an object of the present invention to solve the above-mentioned problem of layer roughening peculiar to a system for effecting LPE growth through the dipping method capable of processing a large number of substrates and to provide an inexpensive and high-performance solar cell.

To achieve the above object, according to a first aspect of the present invention, there is provided a silicon layer growth method comprising dipping a multicrystalline silicon substrate in a solution comprising silicon and lowering the temperature of the solution, to thereby grow a silicon layer on the substrate, wherein the temperature drop rate of the solution during the dipping of the substrate in the solution is decreased with time.

Further, according to a second aspect of the present invention, there is provided a solar cell production method comprising the steps of dipping a multicrystalline silicon substrate in a solution comprising silicon and lowering the temperature of the solution, to thereby grow a silicon layer on the substrate; and forming a pn junction in the silicon layer, wherein the temperature drop rate of the solution during the dipping of the substrate in the solution is decreased with time.

In the present invention, it is preferred that the above-mentioned silicon layer growth method and solar cell production method further comprises, prior to the dipping of the multicrystalline silicon substrate in the solution, the step of etching the substrate such that the arithmetical mean surface roughness of a surface of the substrate falls within the range of 0.07 to 1 μm.

BEST MODE FOR CARRYING OUT THE INVENTION

Figure 1A:
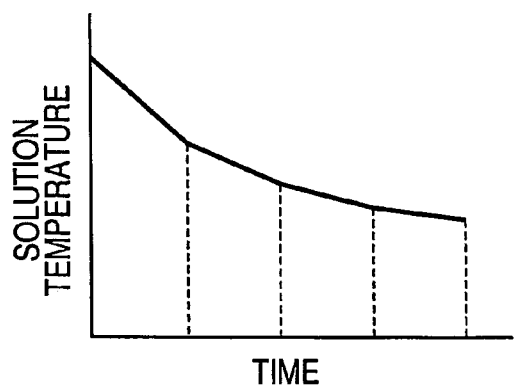
FIGS. 1A and 1B are graphical representations showing examples of solution temperature drop curves in the silicon layer growth method in accordance with the present invention.
Figure 1B:
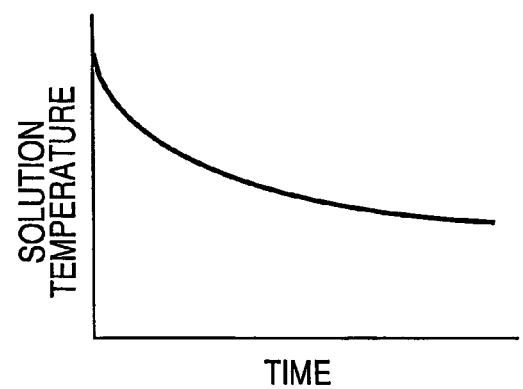

The silicon layer growth method in accordance with the present invention is characterized by decreasing a temperature drop rate with time when lowering the temperature of a solution after dipping a substrate in the solution. FIGS. 1A and 1B show examples of temperature drop curves. FIG. 1A is an example of decreasing a temperature drop rate in multistage and FIG. 1B is an example of decreasing a temperature drop rate gradually. Note that both profiles are monotonic decreasing. It should be pointed out that monotonic decreasing the temperature is critical to avoid the layer thickness reducing. This is a decisive difference between our invention and the prior art (H05-83458). By accomplishing these temperature drop curves, it is possible to continuously grow a silicon layer while suppressing layer roughening even on a substrate with rough surface. The present inventors, through experiments and numerical simulation, have made findings that the temperature drop rate is closely related to a supersaturation degree or growth rate. According to the method of the present invention, it is possible to control the supersaturation degree or growth rate so as not to become too large. The present inventors believe that this makes it possible to suppress layer roughening. Incidentally, the solution temperature when dipping a substrate in a solution may suitably be set. In general, the dipping temperature may be a temperature at which a solution has a saturation concentration of silicon. In some cases, a substrate may be dipped at a temperature at which a solution is either supersaturated or not saturated yet.

As the substrate, a multicrystalline silicon substrate may be used which has been cut out from a multicrystalline silicon ingot with a wire saw or the like. The cut out substrate is etched with a mixed acid of hydrofluoric acid, nitric acid, acetic acid, phosphoric acid, and the like to thereby remove surface damages caused at the time of cutting off and flattened to a preferable degree by the silicon layer growth method in accordance with the present invention. When a multicrystalline silicon substrate is etched with a mixed acid, a surface of the substrate reflects crystal orientation of crystal grains to be covered with fine shapes, such as of concave lens, concave triangle, or concave hexagon.

It is preferable that the arithmetical mean surface roughness of a substrate surface is not less than 0.07 μm but no more than 1 μm. When the arithmetical mean surface roughness is more than 1 μm, it is difficult to effect LPE growth while suppressing roughening. On the other hand, the smaller the substrate surface roughness, the more hardly a grown layer is roughened. However, in the case of etching using a mixed acid, it is actually difficult to make the arithmetical mean surface roughness less than 0.07 μm. Moreover, polishing a substrate by a mechanical or chemical/mechanical method makes it possible to decrease the arithmetical mean surface roughness of a substrate surface to about 0.05 μm, but the cost is extremely increased, which will diminish the above-mentioned cost advantage over a solar cell directly formed in a high-quality multicrystalline substrate. Therefore, to prepare a substrate suitable for LPE growth through a realistically inexpensive process, it is preferable that the arithmetical mean surface roughness of the substrate is within the above range.

A surface shape of a grown layer is influenced also by the amount of solution. That is, in a system containing a relatively large amount of solution, the problem of layer roughening is liable to occur. On the other hand, when decreasing the amount of solution relative to the surface area of a substrate, layer roughening does not easily occur but it becomes difficult to obtain a thick layer. An LPE apparatus using the dipping method is far superior in productivity to the slide board method and dipping method because it is possible to grow a layer on a plurality of substrates in one batch. With the dipping method, when an interval between opposing substrates is set to be less than about 2 mm and the convection of solution is suppressed, the problem of layer roughening does not easily occur. However, to obtain a layer thickness enough to provide superior characteristics, a lot of time is necessary, which impairs the productivity. Therefore, it is practically preferable to dispose substrates at intervals of 5 mm or more from the viewpoint of productivity. The problem of layer roughening generated in this case can be solved by the present invention. Incidentally, the above substrate intervals are given by way of exemplification and may vary depending also on a substrate holding method.

Figure 2:
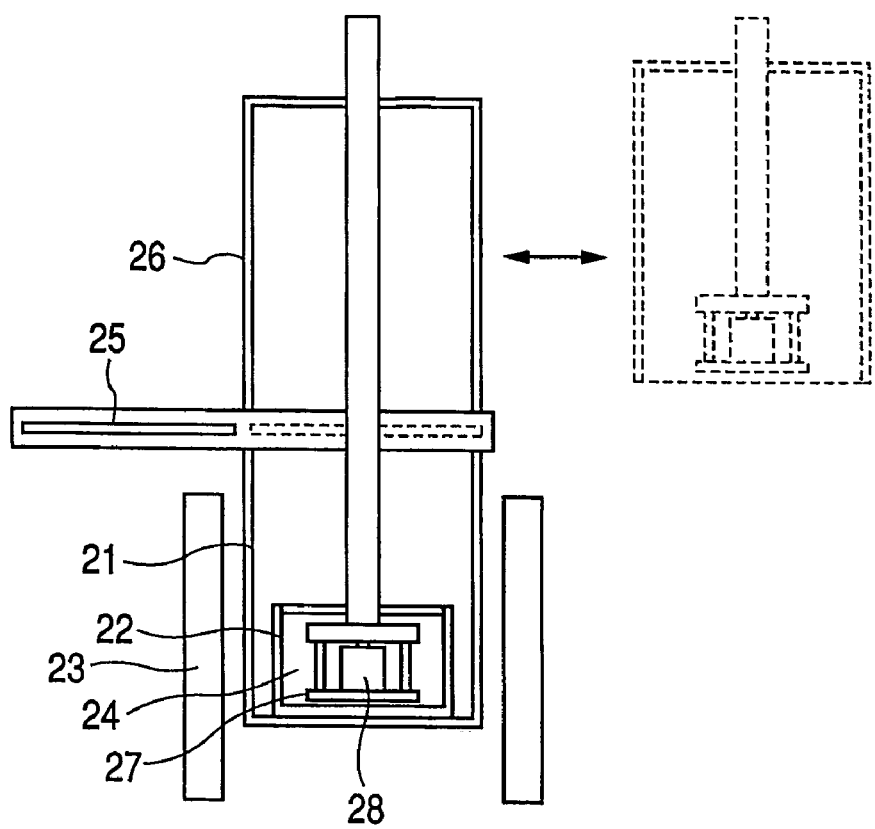
FIG. 2 is a schematic view showing an example of a silicon layer growth apparatus used for the present invention.

FIG. 2 is a schematic view showing an example of an LPE growth apparatus for forming a silicon layer. A growth furnace 21 has a crucible 22 therein and its circumference is surrounded by a heater 23. The crucible 22 holds a solution 24 obtained by dissolving a silicon material in a metal such as tin, gallium, indium, copper, aluminum, bismuth, gold, lead, or the like. The solution 24 may contain a dopant such as gallium, phosphor, boron, or aluminum. A substrate loading chamber 26 is connected to the top of the growth furnace 21 through a gate valve 25. The substrate loading chamber 26 can be moved to right and left and is provided with an attachable/detachable substrate holder 27 therein. The substrate holder 27 can hold a plurality of substrates 28.

The LPE growth is carried out as described below. The gate valve 25 is closed and the growth furnace 21 has a hydrogen atmosphere and is kept at a saturation temperature of a solution. In a state in which the substrate loading chamber 26 is separated from the growth furnace 21 as shown by dashed lines in FIG. 2, the substrates 28 are set in the substrate holder 27, and then the substrate loading chamber 26 is joined to the growth furnace 21 as shown by solid lines in FIG. 2, and the internal atmosphere is substituted with hydrogen. Then, the gate valve 25 is opened, then the substrate holder 27 is lowered, and the substrates 28 are heated for a predetermined period of time in the hydrogen atmosphere. Next, the temperature inside the growth furnace 21 is reduced to a predetermined temperature. When the furnace temperature reaches the predetermined temperature, the substrate holder 27 is further lowered to dip the substrates 28 in the solution 24.

Subsequently, when the temperature of the solution 24 is reduced at a predetermined temperature drop rate as shown in FIG. 1, a silicon layer is epitaxially grown on each substrate 28. After desired layers have been grown, the substrate holder 27 is raised, then the gate valve 25 is closed, then the substrate loading chamber 26 is internally substituted with ambient air and separated from the growth furnace 21, and then the substrates 28 are taken out.

Figure 3:
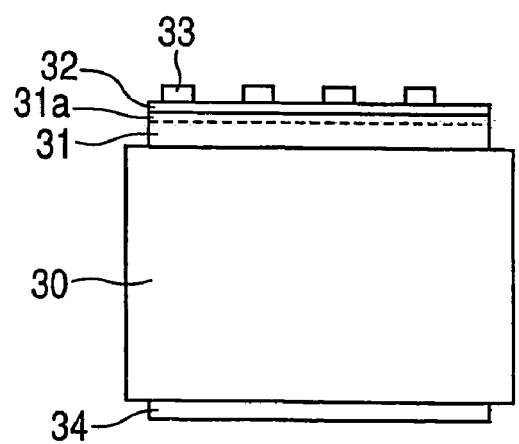
FIG. 3 is a schematic sectional view showing an example of the solar cell obtained by the present invention.

FIG. 3 is a schematic sectional view of a solar cell utilizing a silicon layer prepared in accordance with the present invention. On a substrate 30, a p⁻ silicon layer 31 is formed by the above-described method. On the surface of the silicon layer 31 are formed an n⁺ layer 31a, an antireflection layer 32, and a collecting electrode 33. A back electrode 34 is formed on the back of the substrate 30. The n⁺ layer 31a can be formed on the surface of the silicon layer 31 by using a method such as diffusion or ion implantation. The antireflection layer 32 can be formed by using a method such as sputtering or vacuum evaporation. The collecting electrode 33 and the back electrode 34 can be formed by using a method such as sputtering, vacuum evaporation, or printing. As another configuration of a solar cell, a heterojunction with an amorphous layer may be provided on a multicrystalline silicon substrate. For example, a configuration may be adopted in which an amorphous i layer and an amorphous n layer are stacked on the p⁻ silicon layer 31. Such amorphous layers may be formed by, for example, a CVD process.

EXAMPLES

Though examples of the present invention are described below, the present invention is not limited to these examples.

Example 1

(Pretreatment of Substrates)

Substrates used were metallurgical grade multicrystalline silicon substrates each of 47 mm square and 0.6 mm in thickness. The substrates were cleaned with running water for 5 minutes and then dipped in a mixed liquid of sulfuric acid and hydrogen peroxide solution (3:1 in volume ratio) for 10 minutes. Subsequently, the substrates were cleaned with running water for 5 minutes and then dipped in a mixed liquid of nitric acid, acetic acid and hydrofluoric acid (600:136:64 in volume ratio) for 6 minutes and 30 seconds to etch the surfaces of the substrates. The arithmetical mean surface roughness of the substrate surfaces after the etching ranged between 0.18 µm and 0.43 µm. Finally, the substrates were cleaned with running water for 5 minutes and then dried by dry nitrogen blow, thereby completing the substrate pretreatment.

(Formation of Silicon Layers)

By using a liquid phase growth apparatus of a structure shown in FIG. 2, a silicon layer was epitaxially grown on each of the metallurgical grade multicrystalline silicon substrates. The solution 24 was obtained by dissolving a silicon material up to saturation in 11 kg of indium at 930° C. and the substrate 28 was dipped in the solution 24. The substrates were disposed at intervals of 10 mm with each two substrates forming a pair and facing each other. The lower side of a space sandwiched by the substrates was closed by the substrate holder 27 but the other three sides were open to allow the solution to freely move in and out therethrough. The solution temperature was reduced at 0.25° C./min for the first 30 minutes, 0.20° C./min for subsequent 30 minutes, 0.15° C./min for subsequent 30 minutes, and 0.10° C./min for final 30 minutes. As a result, silicon layers having an average thickness of 28 µm ware obtained. A difference in thickness between a thickest portion and a thinnest portion of the silicon layers was 5 µm.

(Preparation of Solar Cells)

Then, solar cells of the structure shown in FIG. 3 were prepared. The p⁻ silicon layer 31 was formed on the silicon substrate 30 through the LPE growth method as described above. An n-type dispersing agent was applied to the surface of the p⁻ silicon layer 31 in a thickness of 200 nm and then baked at 860° C. to form the n⁺ layer 31a. Then a silicon nitride layer was formed through a CVD method as the antireflection layer 32 and then the silicon nitride layer at a portion on which an electrode was to be formed was removed. An aluminium paste was applied to the back surface of the substrate 30 and baked to form the back electrode 34. Then, silver was deposited in a thickness of 1.4 µm through vacuum evaporation using a mask pattern to form the collecting electrode 33, whereby solar cells were obtained.

Comparative Example 1

Silicon layers were formed and then solar cells were made following the same procedure as in Example with the exception that the conventional linear temperature drop was applied to formation of the silicon layers and the silicon layers were grown at a temperature drop rate of 0.25° C./min for 120 minutes.

As a result, silicon layers of an average thickness of 44 µm were obtained in this Comparative Example 1, and the difference in thickness between a thickest portion and a thinnest portion was 18 µm. Moreover, as a result of comparison with the solar cells of Example 1, the current was larger by 10% but the FF was lower by 40%, so that the conversion efficiency was inferior to that of Example 1.

Comparative Example 2

Silicon layers were formed and then solar cells were made following the same procedure as in Example with the exception that the conventional linear temperature drop was applied to formation of the silicon layers and the silicon layers were grown at a temperature drop rate of 0.25° C./min for a shorter period of time than 120 minutes.

As a result, silicon layers of an average thickness of 28 µm were obtained in this Comparative Example 1, but the difference in thickness between a thickest portion and a thinnest portion was 10 µm. Moreover, as a result of comparison with the solar cells of Example 1, the current was comparable to that of Example 1 but the FF was lower by 20%, so that the conversion efficiency was inferior to that of Example 1.

Comparative Example 3

Silicon layers were formed and then solar cells were made following the same procedure as in Example with the exception that the conventional linear temperature drop was applied to formation of the silicon layers and the silicon layers were grown at a temperature drop rate of 0.10° C./min for 120 minutes.

As a result, in this Comparative Example 3, silicon layers were obtained in which the difference in thickness between a thickest portion and a thinnest portion was 4 μm, but the average thickness was only 8 μm. Moreover, as a result of comparison with the solar cells of Example 1, the FF was comparable to that of Example 1 but the current was smaller by 23%, so that the conversion efficiency was inferior to that of Example 1.

INDUSTRIAL APPLICABILITY

As described above, according to the present invention, a silicon layer production method is provided that can give a thick layer while suppressing the degree of roughening, thereby providing a multicrystalline-silicon solar-cell production method that attains a large current and a high FF at a low cost.

This application claims priority from Japanese Patent Application No. 2004-156968 filed May 27, 2004, which is hereby incorporated by reference herein.

The invention claimed is:

1. A silicon layer growth method comprising dipping a multicrystalline silicon substrate in a solution comprising silicon and lowering the temperature of the solution, to thereby grow a silicon layer on the substrate, wherein the temperature is monotonic decreasing and the temperature drop rate of the solution during the dipping of the substrate in the solution is decreased with time.

2. The silicon layer growth method according to claim 1, further comprising, prior to the dipping of the multicrystalline silicon substrate in the solution, a step of etching the substrate such that the arithmetical mean surface roughness of a surface of the substrate falls within a range of 0.07 to 1 μm.

3. A solar cell production method comprising the steps of:
dipping a multicrystalline silicon substrate in a solution comprising silicon and lowering the temperature of the solution, to thereby grow a silicon layer on the substrate; and
forming a pn junction in the silicon layer, wherein the temperature is monotonic decreasing and the temperature drop rate of the solution during the dipping of the substrate in the solution is decreased with time.

4. The solar cell production method according to claim 3, further comprising, prior to the dipping of the multicrystalline silicon substrate in the solution, a step of etching the substrate such that the arithmetical mean surface roughness of a surface of the substrate falls within a range of 0.07 to 1 μm.

* * * * *